(12) United States Patent
Schneider et al.

(10) Patent No.: US 9,071,267 B1
(45) Date of Patent: *Jun. 30, 2015

(54) MULTI-PATH ANALOG FRONT END AND ANALOG-TO-DIGITAL CONVERTER FOR A SIGNAL PROCESSING SYSTEM

(71) Applicant: Cirrus Logic, Inc., Austin, TX (US)

(72) Inventors: Edmund Mark Schneider, Austin, TX (US); Aniruddha Satoskar, Austin, TX (US); Daniel J. Allen, Austin, TX (US); Seyedeh Maryam Mortazavi Zanjani, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/480,180

(22) Filed: Sep. 8, 2014

Related U.S. Application Data

(63) Continuation of application No. 14/476,507, filed on Sep. 3, 2014.

(60) Provisional application No. 61/948,307, filed on Mar. 5, 2014.

(51) Int. Cl.
| | |
|---|---|
| *H03M 1/12* | (2006.01) |
| *H03M 1/18* | (2006.01) |
| *H03M 1/00* | (2006.01) |
| *H03M 1/06* | (2006.01) |
| *H04R 3/04* | (2006.01) |

(52) U.S. Cl.
CPC ............. *H03M 1/188* (2013.01); *H03M 1/002* (2013.01); *H03M 1/0631* (2013.01); *H04R 3/04* (2013.01); *H04R 2420/01* (2013.01)

(58) Field of Classification Search
CPC ..... H03M 3/324; H03M 3/384; H03M 3/406; H03M 3/43; H03M 3/454; H03M 3/458; H03M 1/188; H03M 3/434; H03M 1/12
USPC .................................................. 341/155, 156
See application file for complete search history.

(56) References Cited

U.S. PATENT DOCUMENTS

| | | | |
|---|---|---|---|
| 4,972,436 | A | 11/1990 | Halim et al. |
| 4,999,830 | A | 3/1991 | Agazzi |
| 5,148,167 | A | 9/1992 | Ribner |
| 5,321,758 | A | 6/1994 | Charpentier et al. |
| 5,600,317 | A | 2/1997 | Knoth et al. |
| 5,714,956 | A | 2/1998 | Jahne et al. |
| 6,271,780 | B1 | 8/2001 | Gong et al. |
| 6,768,443 | B2 | 7/2004 | Willis |
| 7,403,010 | B1 | 7/2008 | Hertz |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Jean B Jeanglaude
(74) *Attorney, Agent, or Firm* — Jackson Walker L.L.P.

(57) ABSTRACT

A processing system may include multiple selectable processing paths for processing an analog signal in order to reduce noise and increase dynamic range. Techniques are employed to transition between processing paths and calibrate operational parameters of the two paths in order to reduce or eliminate artifacts caused by switching between processing paths.

24 Claims, 2 Drawing Sheets

(56) References Cited

U.S. PATENT DOCUMENTS

| | | | |
|---|---|---|---|
| 7,522,677 B2* | 4/2009 | Liang | 375/316 |
| 7,583,215 B2 | 9/2009 | Yamamoto et al. | |
| 8,060,663 B2* | 11/2011 | Murray et al. | 710/8 |
| 8,289,425 B2* | 10/2012 | Kanbe | 348/300 |
| 8,330,631 B2 | 12/2012 | Kumar et al. | |
| 2008/0159444 A1* | 7/2008 | Terada | 375/340 |
| 2009/0021643 A1* | 1/2009 | Hsueh et al. | 348/572 |
| 2011/0096370 A1* | 4/2011 | Okamoto | 358/444 |
| 2011/0242614 A1* | 10/2011 | Okada | 358/445 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

* cited by examiner

US 9,071,267 B1

MULTI-PATH ANALOG FRONT END AND ANALOG-TO-DIGITAL CONVERTER FOR A SIGNAL PROCESSING SYSTEM

RELATED APPLICATIONS

The present disclosure claims priority to U.S. Provisional Patent Application Ser. No. 61/948,307, filed Mar. 5, 2014, which is incorporated by reference herein in its entirety.

The present patent application is a continuation of a previously filed patent application, U.S. patent application Ser. No. 14/476,507, filed Sep. 3, 2014, the entirety of which is hereby incorporated by reference.

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent") and U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of it in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allows the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level. However, existing approaches to multipath AFEs/ADCs do not scale well to the integrated circuit level.

SUMMARY

In accordance with the teachings of the present disclosure, certain disadvantages and problems associated with implementation of a multiple AFE/ADC paths may be reduced or eliminated.

In accordance with embodiments of the present disclosure, a processing system may include a plurality of processing paths and a controller. The plurality of processing paths includes a first processing path and a second processing path. The first processing path may comprise a first analog front end, and a first digital processing subsystem having a first analog-to-digital converter, wherein the first analog front end includes an inverting amplifier configured to amplify an analog input signal to generate a first amplified analog signal and the first digital processing subsystem is configured to convert the first amplified analog signal into a first digital signal. The second processing path may comprise a second analog front end, and a second digital processing subsystem having a second analog-to-digital converter, wherein the second analog front end includes a non-inverting amplifier configured to amplify the analog input signal to generate a second amplified analog signal and the digital processing subsystem is configured to convert the second amplified analog signal into a second digital signal. The controller may be configured to select one of the first digital signal and the second digital signal as a digital output signal of the processing system based on a magnitude of the analog input signal.

In accordance with these and other embodiments of the present disclosure, a processing system may include a plurality of processing paths and a controller. The plurality of processing paths may include a first processing path and a second processing path. The first processing path may comprise a first analog front end and a first digital processing subsystem having a first analog-to-digital converter, wherein the first analog front end is configured to amplify an analog input signal in order to generate a first amplified analog signal and the first analog-to-digital converter is configured to convert the first amplified analog signal into a first digital signal. The second processing path may comprise a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end. The controller may be configured to select one of the first digital signal and the second digital signal as a digital output signal of the processing system based on a magnitude of the analog input signal. The controller may also be configured to, when selecting the first digital signal as the digital output signal, transition continuously or in steps the digital output signal between the second digital signal and the first digital signal during a duration of time, such that during such transition, the digital output signal is a weighted average of the first digital signal and the second digital signal wherein a weight of the first digital signal relative to a weight of the second digital signal increases during such transition. The controller may further be configured to, when selecting the second digital signal as the digital output signal, transition continuously or in steps the digital output signal between the first digital signal and the second digital signal, wherein a rate of transition is based on the magnitude of the analog input signal, and such that during such transition, the digital output signal is a weighted average of the first digital signal and the second digital signal wherein a weight of the second digital signal relative to a weight of the first digital signal increases during the transition.

In accordance with these and other embodiments of the present disclosure, a processing system may include a plurality of processing paths and a controller. The plurality of processing paths may include a first processing path and a second processing path. The first processing path may comprise a first analog front end and a first digital processing subsystem having a first analog-to-digital converter, wherein the first analog front end is configured to amplify an analog input signal in order to generate a first amplified analog signal and the first analog-to-digital converter is configured to convert the first amplified analog signal into a first digital signal, and further wherein the first analog-to-digital converter comprises a first modulator configured to receive the first amplified input signal and a first digital decimator configured to receive an output of the first modulator. The second processing path may comprise a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, further wherein the second analog-to-digital converter comprises a second modulator configured to receive the second amplified input signal and a second digital decimator configured to receive an output of the second modulator, and further wherein a magnitude of the gain of the second analog front end is substantially larger than a magnitude of a gain of the first analog front end. The controller may be configured to switch selection from the second digital signal to the first digital signal based on the output of the second modulator.

In accordance with these and other embodiments of the present disclosure, a processing system may include a plurality of processing paths and a controller. The plurality of processing paths may include a first processing path and a second processing path. The first processing path may have a first path gain and may be configured to generate a first analog signal based on an analog input signal. The second processing path may have a second path gain and may be configured to generate a second analog signal based on the analog input signal. The controller may be configured to select one of the first digital signal and the second digital signal as a digital output signal of the processing system based on a magnitude of the analog input signal, determine a scale factor indicative of the magnitude of difference between the first path gain and the second path gain, and prior to switching selection between the first digital signal and the second digital signal, apply an additional gain based on the scale factor to one or both of the first path gain and the second path gain to compensate for the magnitude of difference between the first path gain and the second path gain.

In accordance with these and other embodiments of the present disclosure, a method may include processing an analog input signal with a first processing path, wherein the first processing path comprises a first analog front end, and a first digital processing subsystem having a first analog-to-digital converter, wherein the first analog front end includes an inverting amplifier configured to amplify the analog input signal to generate a first amplified analog signal and the first digital processing subsystem is configured to convert the first amplified analog signal into a first digital signal. The method may also include processing the analog input signal with a second processing path, wherein the second processing path comprises a second analog front end, and a second digital processing subsystem having a second analog-to-digital converter, wherein the second analog front end includes a non-inverting amplifier configured to amplify the analog input signal to generate a second amplified analog signal and the digital processing subsystem is configured to convert the second amplified analog signal into a second digital signal. The method may further include selecting one of the first digital signal and the second digital signal as a digital output signal of the processing system based on a magnitude of the analog input signal.

In accordance with these and other embodiments of the present disclosure, a method may include processing an analog input signal with a first processing path, wherein the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into a first digital signal. The method may also include processing the analog input signal with a second processing path, wherein the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end. The method may further include selecting one of the first digital signal and the second digital signal as a digital output signal of the processing system based on a magnitude of the analog input signal. The method may additionally include, when selecting the first digital signal as the digital output signal, transitioning continuously or in steps the digital output signal between the second digital signal and the first digital signal during a duration of time, such that during such transition, the digital output signal is a weighted average of the first digital signal and the second digital signal wherein a weight of the first digital signal relative to a weight of the second digital signal increases during such transition. The method may also include, when selecting the second digital signal as the digital output signal, transitioning continuously or in steps the digital output signal between the first digital signal and the second digital signal, wherein a rate of transition is based on the magnitude of the analog input signal, and such that during such transition, the digital output signal is a weighted average of the first digital signal and the second digital signal wherein a weight of the second digital signal relative to a weight of the first digital signal increases during the transition.

In accordance with these and other embodiments of the present disclosure, a method may include processing an analog input signal with a first processing path, wherein the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into a first digital signal, and further wherein the first analog-to-digital converter comprises a first modulator configured to receive the first amplified input signal and a first digital decimator configured to receive an output of the first modulator. The method may also include processing the analog input signal with a second processing path, wherein the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, further wherein the second analog-to-digital converter comprises a second modulator configured to receive the second amplified input signal and a second digital decimator configured to receive an output of the second modulator, and further wherein a magnitude of the gain of the second analog front end is substantially larger than a magnitude of a gain of the first analog front end. The method may further include switching selection from the second digital signal to the first digital signal based on the output of the second modulator.

In accordance with these and other embodiments of the present disclosure, a method may include processing an analog input signal by a first processing path having a first path gain and configured to generate a first analog signal based on an analog input signal. The method may also include processing the analog input signal by a second processing path having a second path gain and configured to generate a second analog signal based on the analog input signal. The method may further include selecting one of the first digital signal and the second digital signal as a digital output signal of the processing system based on a magnitude of the analog input signal. The method may additionally include determining a scale factor indicative of the magnitude of difference between first path gain and second path gain. The method may also include, prior to switching selection between the first digital signal and the second digital signal, applying an additional gain based on the scale factor to one or both of the first path gain and the second path gain to compensate for the magnitude of difference between the first path gain and the second path gain.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
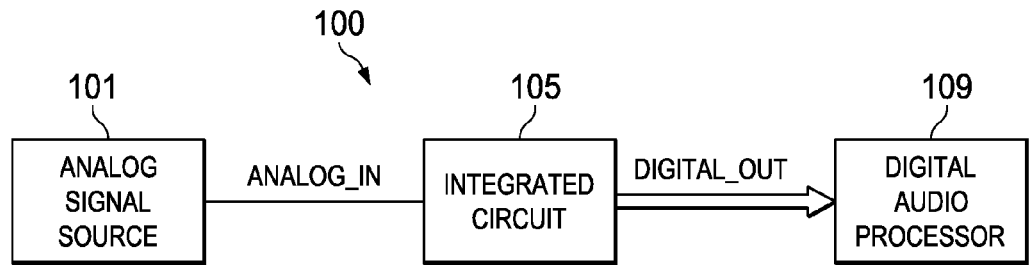
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
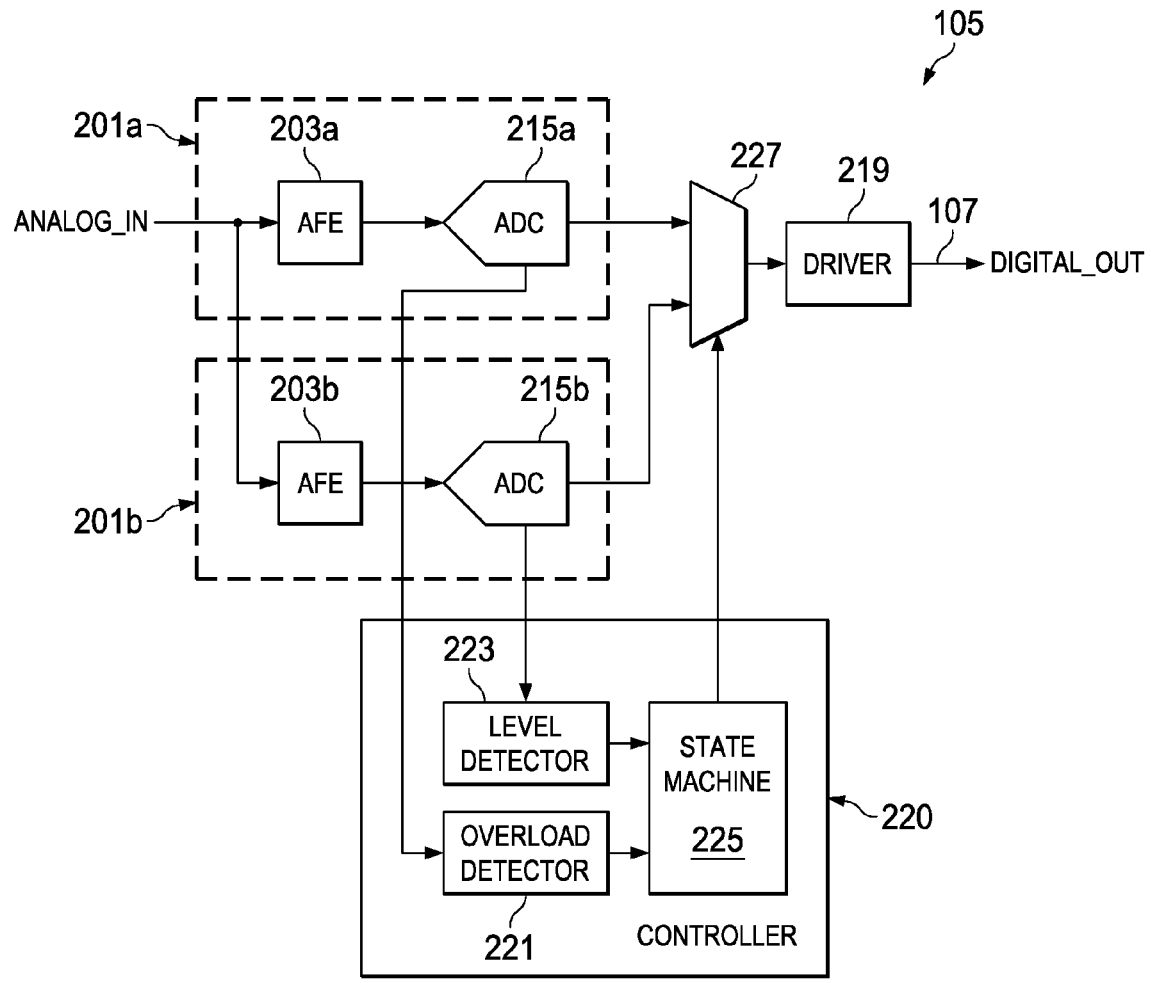
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC (e.g., ADC 215a, ADC 215b). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203a and 203b are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215a and 215b are discussed in greater detail below with respect to FIG. 3.

A multiplexer 227 may receive a respective digital signal from each of processing paths 201 and may select one of the digital signals as digital output signal DIGITAL_OUT based on a control signal generated by and communicated from a controller 220.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Controller 220 may comprise any suitable system, device, or apparatus for selecting one of the digital signals output by the various processing paths 201 as digital output signal DIGITAL_OUT. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN (e.g., an output of a modulator 316a of delta-sigma modulator 308a, as shown in greater detail in FIG. 3) is likely to cause clipping or other distortion of digital output signal DIGITAL_OUT if a particular processing path (e.g., processing path 201a) is selected. If clipping or other distortion of digital output signal DIGITAL_OUT is likely if the particular processing path (e.g., processing path 201a) is selected, state machine 225 of controller 220 may generate a control signal so that another processing path (e.g., processing path 201b) is selected. To further illustrate, in some embodiments, processing path 201a may be a path adapted for low amplitudes of analog input signal ANALOG_IN and may thus have a high signal gain, while processing path 201b may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201a is selected, overload detector 221 may detect such condition, and cause state machine 225 to generate a control signal to select the digital signal generated by processing path 201b as digital output signal DIGITAL_OUT.

As another example, controller 220 may include a level detector 223 that may detect an amplitude of analog input signal ANALOG_IN or a signal derivative thereof (e.g., a signal generated within ADC 215b) and communicate a signal indicative of such amplitude to state machine 225. Responsive to the signal received from level detector 223, state machine 225 may generate the control signal communicated to multiplexer 227. To illustrate, as analog input signal ANALOG_IN decreases from a relatively high amplitude to a lower amplitude, it may cross a threshold amplitude level whereby controller 220 may change the selection of digital output signal DIGITAL_OUT from the digital signal generated by processing path 201b (which may be adapted for higher amplitudes of analog input signal ANALOG_IN) to the digital signal generated by processing path 201a (which may be adapted for lower amplitudes of analog input signal ANALOG_IN). In some embodiments, a threshold amplitude level whereby controller 220 may change the selection of digital output signal DIGITAL_OUT from the digital signal generated by processing path 201b to the digital signal generated by processing path 201a may be lower than another threshold amplitude level whereby controller 220 may change the selection of digital output signal DIGITAL_OUT from the digital signal generated by processing path 201a to the digital signal generated by processing path 201b, in order to provide for hysteresis so that multiplexer 227 does not repeatedly switch between the paths.

Figure 3:
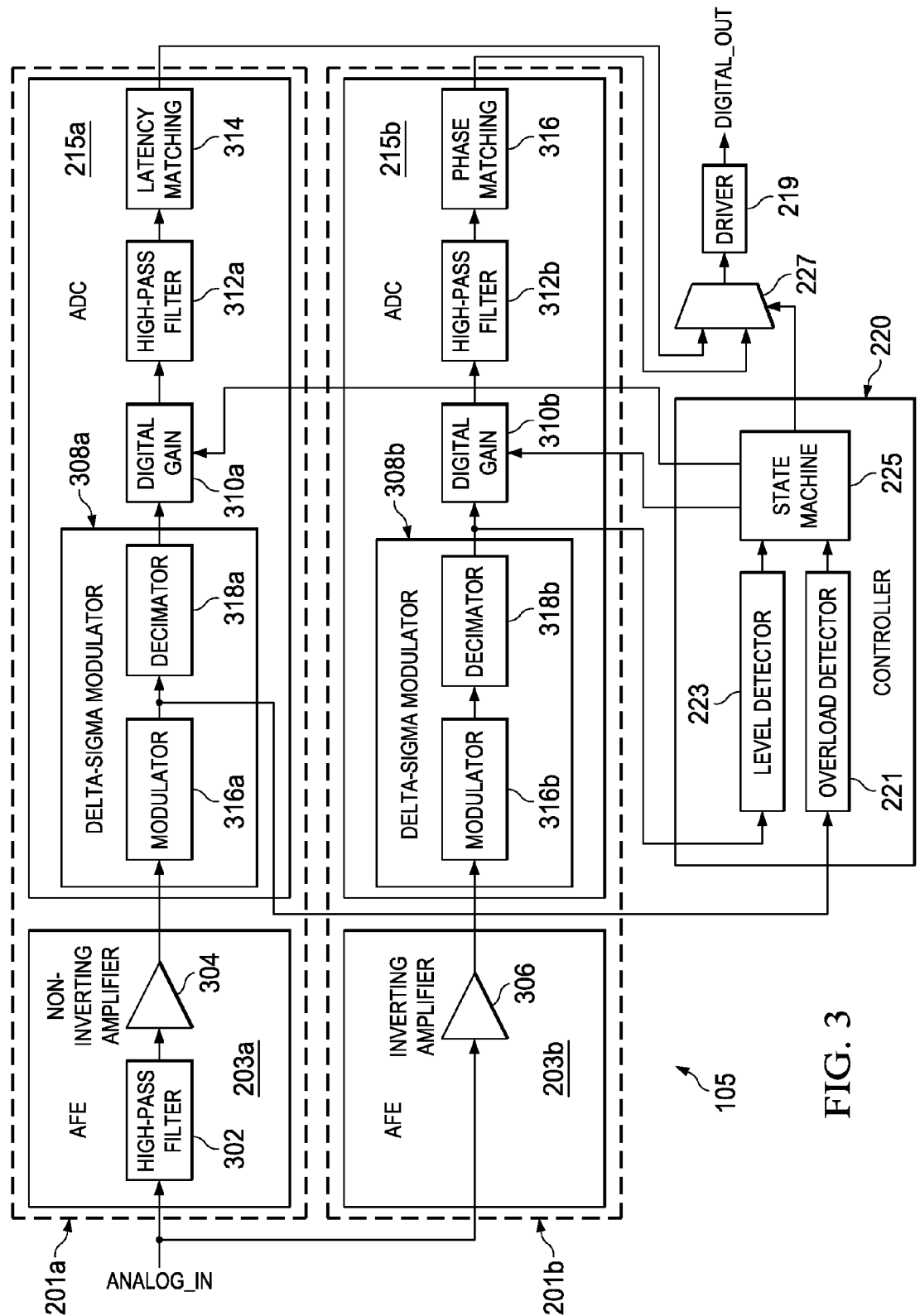
FIG. 3 illustrates a block diagram of selected components of the integrated circuit of FIG. 2 depicting selected components of example embodiments of analog front ends and analog-to-digital converters, in accordance with embodiments of the present disclosure.

FIG. 3 illustrates a block diagram of selected components of integrated circuit 105 depicting selected components of example embodiments of AFEs 203 and ADCs 215, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 316 to account for any phase offset between processing path 201a and processing path 201b. For example, phase matching element 316 may dynamically compensate for any phase mismatch between processing paths 201a and 201b by varying a delay of at least one of processing path 201a and processing path 201b. In some embodiments, phase matching element 316 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals.

In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain To illustrate, controller 220 may determine a scale factor indicative of the magnitude of difference (e.g., whether an intentional difference or unintentional mismatch) between first path gain of processing path 201a and the second path gain of processing path 201b. The controller may determine first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215a and the second digital signal generated by ADC 215b (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201a when the digital signal of ADC 215b is selected as digital output signal DIGITAL_OUT and apply the additional gain to processing path 201b when the digital signal of ADC 215a is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

In some embodiments, switching selection of digital output signal DIGITAL_OUT from the digital signal of ADC 215a to the digital signal of ADC 215b (or vice versa), may occur substantially immediately. However, in some embodiments, to reduce or eliminate artifacts from occurring when switching selection of digital output signal DIGITAL_OUT from the digital signal of ADC 215a to the digital signal of ADC 215b (or vice versa), controller 220 and multiplexer 227 may be configured to transition continuously or in steps digital output signal DIGITAL_OUT from a first digital signal to a second digital signal such that during such transition, digital output signal DIGITAL_OUT is a weighted average of the first digital signal and the second digital signal wherein a weight of the second digital signal relative to a weight of the first digital signal increases during the transition. For example, if a transition is desired between digital signal of ADC 215a and digital signal of ADC 215b as digital output signal DIGITAL_OUT, such transition may be in steps, wherein in each step, controller 220 and/or multiplexer 227 weighs digital signals output by ADCs 215 as follows:

1) 100% digital signal of ADC 215a and 0% digital signal of ADC 215b;
2) 80% digital signal of ADC 215a and 20% digital signal of ADC 215b;
3) 60% digital signal of ADC 215a and 40% digital signal of ADC 215b;
4) 30% digital signal of ADC 215a and 70% digital signal of ADC 215b;
5) 10% digital signal of ADC 215a and 90% digital signal of ADC 215b; and
6) 0% digital signal of ADC 215a and 100% digital signal of ADC 215b.

As another example, if a transition is desired between digital signal of ADC 215b and digital signal of ADC 215a as digital output signal DIGITAL_OUT, such transition may be in steps, wherein in each step, controller 220 and/or multiplexer 227 weighs digital signals output by ADCs 215 as follows:

1) 100% digital signal of ADC 215b and 0% digital signal of ADC 215a;
2) 70% digital signal of ADC 215b and 30% digital signal of ADC 215a;
3) 60% digital signal of ADC 215b and 40% digital signal of ADC 215a;
4) 20% digital signal of ADC 215b and 80% digital signal of ADC 215a;
5) 5% digital signal of ADC 215b and 95% digital signal of ADC 215a; and
6) 0% digital signal of ADC 215b and 100% digital signal of ADC 215a.

In some embodiments, a transition in digital output signal DIGITAL_OUT (either continuously or in steps) from the digital signal of ADC 215a to the digital signal of ADC 215b (or vice versa) may occur over a defined maximum duration of time. In these and other embodiments, when transitioning (either continuously or in steps) digital output signal DIGITAL_OUT from the digital signal of ADC 215b to the digital signal of ADC 215a, a rate of transition may be based on a magnitude of analog input signal ANALOG_IN (e.g., the rate of transition may be faster at lower amplitudes and slower at higher amplitudes). In such embodiments, the minimum rate of such transition may be limited such that the transition occurs over a defined maximum duration of time, wherein the maximum duration of time is independent of the magnitude of the analog input signal.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A processing system comprising:
a plurality of processing paths including a first processing path and a second processing path, wherein:
the first processing path comprises a first analog front end and a first digital processing subsystem having a first analog-to-digital converter, wherein the first analog front end is configured to amplify an analog input signal in order to generate a first amplified analog signal and the first analog-to-digital converter is configured to convert the first amplified analog signal into a first digital signal; and
the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end; and
a controller configured to:
select one of the first digital signal and the second digital signal as a digital output signal of the processing system based on a magnitude of the analog input signal; and
when selecting the first digital signal as the digital output signal, transition continuously or in steps the digital output signal between the second digital signal and the first digital signal during a duration of time, such that during such transition, the digital output signal is a weighted average of the first digital signal and the second digital signal wherein a weight of the first digital signal relative to a weight of the second digital signal increases during such transition.

2. The processing system of claim 1, wherein the controller is further configured to transition the digital output signal between the first digital signal and the second digital signal over a maximum duration of time, wherein the maximum duration of time is independent of the magnitude of the analog input signal.

3. The processing system of claim 2, wherein a first path gain equal to the product of the gain of the first analog front end and the first digital processing subsystem is substantially equal to a second path gain equal to the product of the gain of the second analog front end and the second digital processing subsystem.

4. The processing system of claim 3, wherein the controller is further configured to:
   determine a scale factor indicative of the magnitude of difference between first path gain and second path gain; and
   prior to switching selection between the first digital signal and the second digital signal, apply an additional gain based on the scale factor to one or both of the first path gain and the second path gain to compensate for the magnitude of difference between the first path gain and the second path gain.

5. The processing system of claim 4, wherein the controller is configured to determine the scale factor by calculating one of a root mean square average of the first path gain and the second path gain and a least mean squares estimate of the difference between the first path gain and the second path gain.

6. The processing system of claim 4, wherein the controller applies the additional gain to the first processing path if the second digital signal is selected as the digital output signal and applies the additional gain to the second processing path if the first digital signal is selected as the digital output signal.

7. The processing system of claim 4, wherein the controller applies the additional gain to the first processing path if a selection of the digital output signal switches between the second digital signal to the first digital signal and applies the additional gain to the second processing path if a selection of the digital output signal switches between the first digital signal to the second digital signal.

8. The processing system of claim 3, wherein one or both of the first digital processing subsystem and the second digital processing subsystem comprise a respective gain element, wherein each respective gain element is configured to apply a digital gain to an output of a respective one of the first analog-to-digital converter and the second analog-to-digital converter.

9. The processing system of claim 8, wherein the controller is further configured to:
   determine a phase mismatch between the first digital signal and the second digital signal; and
   dynamically compensate for the phase mismatch by varying a delay of at least one of the first processing path and the second processing path.

10. The processing system of claim 1, wherein the processing system is an audio processing system, and the analog input signal and the digital output signal are each an audio signal.

11. The processing system of claim 1, wherein the controller is further configured to, when selecting the second digital signal as the digital output signal, transition continuously or in steps the digital output signal between the first digital signal and the second digital signal, wherein a rate of transition is based on the magnitude of the analog input signal, and such that during such transition, the digital output signal is a weighted average of the first digital signal and the second digital signal, wherein a weight of the second digital signal relative to a weight of the first digital signal increases during the transition.

12. The processing system of claim 1, wherein the controller is further configured to, when selecting the second digital signal as the digital output signal, transition the digital output signal between the second digital signal and the first digital signal over a maximum duration of time, wherein the maximum duration of time is independent of the magnitude of the analog input signal.

13. A method comprising:
   processing an analog input signal with a first processing path, wherein the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into a first digital signal;
   processing the analog input signal with a second processing path, wherein the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end;
   selecting one of the first digital signal and the second digital signal as a digital output signal of the processing system based on a magnitude of the analog input signal; and
   when selecting the first digital signal as the digital output signal, transitioning continuously or in steps the digital output signal between the second digital signal and the first digital signal during a duration of time, such that during such transition, the digital output signal is a weighted average of the first digital signal and the second digital signal, wherein a weight of the first digital signal relative to a weight of the second digital signal increases during such transition.

14. The method of claim 13, further comprising transitioning the digital output signal between the first digital signal and the second digital signal over a maximum duration of time, wherein the maximum duration of time is independent of the magnitude of the analog input signal.

15. The method of claim 14, wherein a first path gain equal to the product of the gain of the first analog front end and the first digital processing subsystem is substantially equal to a second path gain equal to the product of the gain of the second analog front end and the second digital processing subsystem.

16. The method of claim 15, further comprising:
   determining a scale factor indicative of the magnitude of difference between first path gain and second path gain; and
   prior to switching selection between the first digital signal and the second digital signal, applying an additional gain based on the scale factor to one or both of the first path gain and the second path gain to compensate for the magnitude of difference between the first path gain and the second path gain.

17. The method of claim 16, further comprising determining the scale factor by calculating one of a root mean square average of the first path gain and the second path gain and a least mean squares estimate of the difference between the first path gain and the second path gain.

18. The method of claim 16, further comprising applying the additional gain to the first processing path if the second digital signal is selected as the digital output signal and applying the additional gain to the second processing path if the first digital signal is selected as the digital output signal.

19. The method of claim 16, applying the additional gain to the first processing path if a selection of the digital output signal switches between the second digital signal to the first digital signal and applying the additional gain to the second processing path if a selection of the digital output signal switches between the first digital signal to the second digital signal.

20. The method of claim 15, wherein one or both of the first digital processing subsystem and the second digital processing subsystem comprise a respective gain element, and wherein the method further comprises applying a digital gain by each respective gain element to an output of a respective one of the first analog-to-digital converter and the second analog-to-digital converter.

21. The method of claim 20, further comprising:
determining a phase mismatch between first digital signal and the second digital signal; and
dynamically compensating for the phase mismatch by varying a delay of at least one of the first processing path and the second processing path.

22. The method of claim 13, wherein the analog input signal and the digital output signals are each an audio signal.

23. The method of claim 13, further comprising when selecting the second digital signal as the digital output signal, transitioning continuously or in steps the digital output signal between the first digital signal and the second digital signal, wherein a rate of transition is based on the magnitude of the analog input signal, and such that during such transition, the digital output signal is a weighted average of the first digital signal and the second digital signal, wherein a weight of the second digital signal relative to a weight of the first digital signal increases during the transition.

24. The method of claim 13, further comprising when selecting the second digital signal as the digital output signal, transitioning the digital output signal between the second digital signal and the first digital signal over a maximum duration of time, wherein the maximum duration of time is independent of the magnitude of the analog input signal.

* * * * *